United States Patent [19]

Wykes et al.

[11] Patent Number: 5,764,074

[45] Date of Patent: *Jun. 9, 1998

[54] SYSTEM FOR, AND METHOD OF, MINIMIZING NOISE IN AN INTEGRATED CIRCUIT CHIP

[75] Inventors: Michael D. Wykes, Spring Valley; Michael J. Brunolli, Escondido, both of Calif.

[73] Assignee: Brooktree Corporation, San Diego, Calif.

[*] Notice: The term of this patent shall not extend beyond the expiration date of Pat. No. 5,596,284.

[21] Appl. No.: 715,234

[22] Filed: Sep. 18, 1996

Related U.S. Application Data

[63] Continuation of Ser. No. 338,012, Nov. 10, 1994, Pat. No. 5,596,284.
[51] Int. Cl.[6] ................................................. H03K 17/16
[52] U.S. Cl. ........................... 326/27; 326/21; 326/93
[58] Field of Search ........................ 326/21, 26, 27–28, 326/93

[56] References Cited

U.S. PATENT DOCUMENTS 5,229,657  7/1993  Rackley ........................... 326/26

5,596,284  1/1997  Wykes et al. ..................... 326/27

*Primary Examiner*—David R. Hudspeth
*Attorney, Agent, or Firm*—William C. Cray; Susie H. Oh

[57] ABSTRACT

The noise from the effects of currents through distributed capacitances between electrical circuitry on an integrated circuit chip and the chip substrate is minimized, especially for analog circuitry mixed on the chip with digital circuitry. The invention separates a plurality of bits in each digital word into a plurality (e.g. 2) of segments. A first register off the chip latches the first bits in each word with a first clock signal. A second register off the chip latches the second bits in each word with a second clock signal delayed from the first clock signal. The first register bits are latched on the chip with the first clock signal by a third register. The delayed second register bits are latched on the chip by a fourth register with the second clock signal or with a delayed first clock signal having the same delay as the second clock signal. Substrate ties for the third and fourth registers may be connected to at least one, preferably a plurality, of bonding pads on the chip. The bits from the third and fourth registers may be combined on the chip into a single word. Alternatively, the bits from the third register may be delayed on the chip by the delay of the second clock signal and combined with the bits from the fourth register. In another alternative, the combined signals may be re-registered on the chip in a fifth register in accordance with a clock signal having the delay of the second clock signal.

7 Claims, 6 Drawing Sheets ns, now U.S. Pat. No. 5,596,284.

SYSTEM FOR, AND METHOD OF, MINIMIZING NOISE IN AN INTEGRATED CIRCUIT CHIP

This is a continuation of application Ser. No. 08/338,012 filed Nov. 10, 1994, now U.S. Pat. No. 5,596,284.

This invention relates to a system for minimizing noise in electrical circuits on integrated circuit chips. More particularly, the invention relates to a system for minimizing the effects of noise produced between electrical circuits on integrated circuit chips and the substrates of the chips. The invention has particular applicability to integrated circuit chips which have mixed signal capability as a result of the inclusion of digital circuitry and analog circuitry on the chips.

Integrated circuit chips are formed from a substrate with electrical circuitry on the substrate. The electrical circuitry has distributed capacitances which may be considered to be connected between the circuitry and the substrate. The distributed capacitances generate noise. The magnitude of the noise generated is dependent upon the voltage and frequency at which the electrical circuitry operates.

Since the frequency of operation of electrical circuitry on integrated circuit chips has been progressively increased as the micron size of the components on the chip has been decreased to values below one micron (1μ), the magnitude of the substrate voltage noise resulting from currents induced through the distributed capacitances on the chip has progressively increased. This increase in the magnitude of the generated noise has not been of great concern in circuitry providing digital signals on an integrated circuit chip since the noise has not been a great factor in distinguishing between a binary 0 and a binary 1. However, the noise has been of increasing concern in analog circuitry on an integrated circuit chip since the analog signals can provide an infinite number of values and the noise generated as a result of current through distributed capacitances can significantly affect these values.

The noise generated by voltages applied to the distributed capacitances on an integrated circuit chip has become of increasing concern in recent years for another important reason. Gates of input/output (I/O) transistors in integrated circuits have been damaged by electrostatic discharges (ESD) of large values. To protect the transistors, ESD protection structures have been included in the integrated circuit chips. These ESD structures prevent any electrostatic charges from damaging the I/O transistors. However, the ESD structures have relatively large distributed capacitances. Because of this, the effects of noise generated in the ESD structures on the integrated circuit chips have become increasingly pronounced.

Attempts have been made for a considerable number of years to reduce the substrate noise produced by the distributed capacitances on integrated circuit chips. For example, a separate connection has been made in recent years from the electrical substrate on the chips to a pad on the periphery of the chip. This pad has then been connected to a reference potential such as logic or analog ground. This has tended to bypass to ground some of the current induced in the substrate directly but other problems remain. The bond wire connection from the pad to the substrate reference potential such as ground has inductance. This inductance causes a voltage to be generated as a result of changes in the current produced through the distributed capacitances. The voltage generated by the inductance constitutes substrate voltage noise.

Attempts have been made for a number of years to minimize the noise produced by the bond wire inductance between the pad and the reference such as ground. For example, the chip substrate has been connected to a plurality of pads and bond wires instead of just one (1) pad. This has reduced the noise by a factor related to the number of pads connecting the electrical circuitry to the reference such as ground. For example, when ten (10) pads connect the electrical circuitry on the chip to the reference such as ground, the noise is reduced by a factor of ten (10) in comparison to the noise produced when only one pad connects the electrical circuitry to the reference such as ground. As many as ten (10) pads have been used for this purpose in the prior art.

As digital signal bus widths have increased and logic signal rise times have decreased, it has even been proposed to increase the number of such pads to as many as twenty (20). This has presented problems. The number of pads on a chip is limited and increased numbers of these pads have to be used to receive inputs or to provide outputs. Furthermore, it has become increasingly difficult to provide a sufficient number of pads on a chip to satisfy all of the needs for pads as the complexity of the chips has increased. The chip complexity has increased because of the decrease of micron size in the components and because of the increase in the number of pads required to handle the bits in each word as a result of recent increases in the number of such bits.

In one embodiment of the invention, the substrate voltage noise from the effects of current through the distributed capacitances between the ESD and I/O electrical circuitry on an integrated circuit chip and the chip substrate is minimized, especially for analog circuitry mixed with digital circuitry on the chip. The invention separates a plurality of bits in each word into a plurality (e.g. 2) of segments. A first register off the chip latches the first bits in each word in accordance with a first clock signal having a particular frequency. A second register off the chip latches the second bits in each word in accordance with a second clock signal having the particular frequency but delayed from the first clock signal.

The first register output bits are latched on the chip by a third register in accordance with the first clock signal. The delayed second register output bits are latched on the chip by a fourth register in accordance with the second clock signal or with the first clock signal having the same delay as the second clock signal. The substrate ties from the third and fourth registers may be connected to at least one, preferably a plurality, of pads on the chip.

The bits from the third and fourth registers may be combined on the chip. Alternatively, the bits from the third register may be delayed on the chip by the delay of the second clock signal and combined with the bits from the fourth register. In either alternative, the combined signals may be re-registered on the chip in a fifth register in accordance with a clock signal having the delay of the second clock signal.

Figure 7:
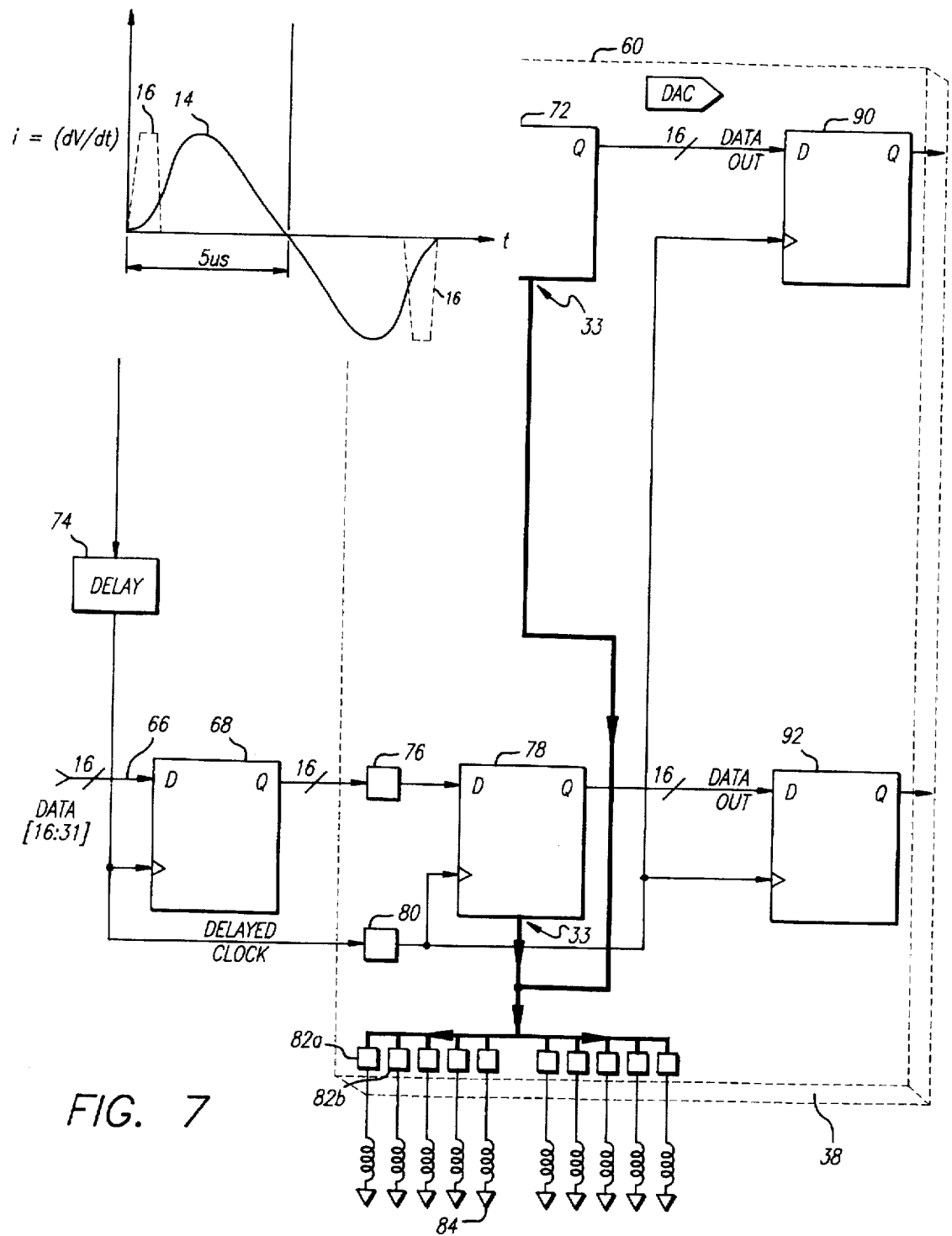
FIG. 7 shows on a simplified block diagram basis one embodiment of the invention for providing an enhanced reduction in the substrate noise resulting from distributed capacitances in integrated circuitry on an integrated circuit chip.
Figure 8:
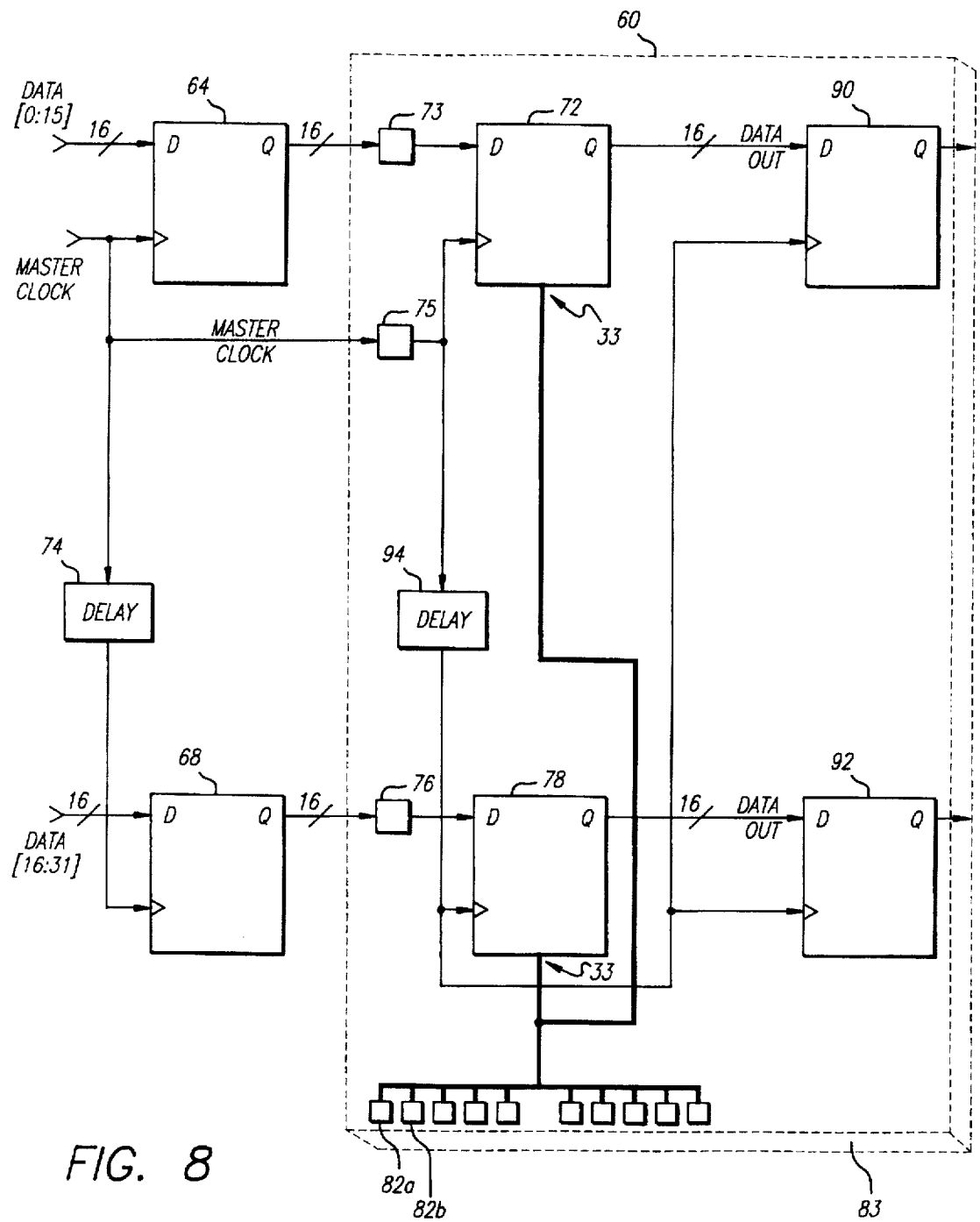
FIG. 8 is a view similar to that shown in FIG. 7 and shows another embodiment of the invention, this embodiment being advantageous in minimizing the number of pads on the chip for providing the substrate noise reduction.
Figure 9:
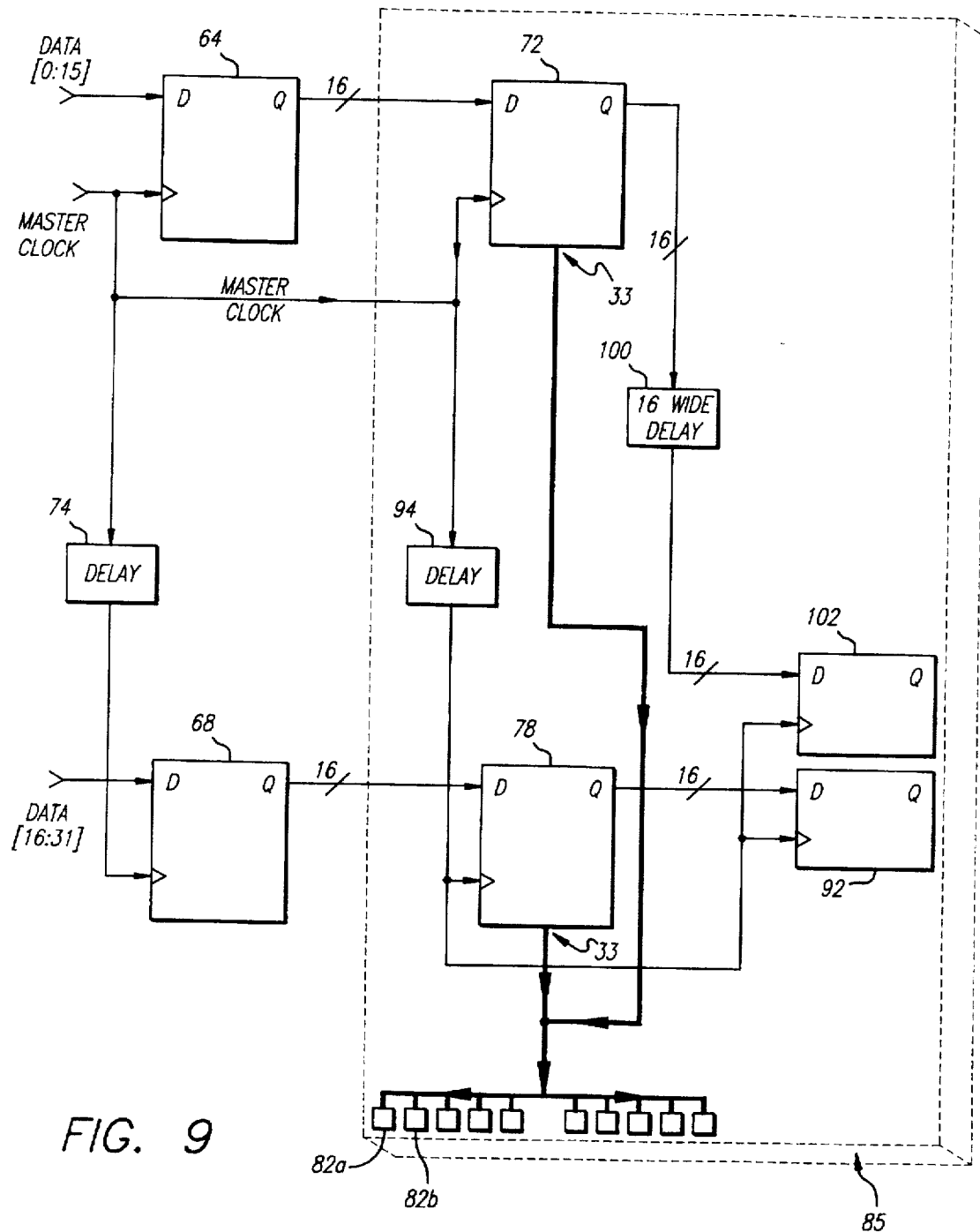
Figure 10:
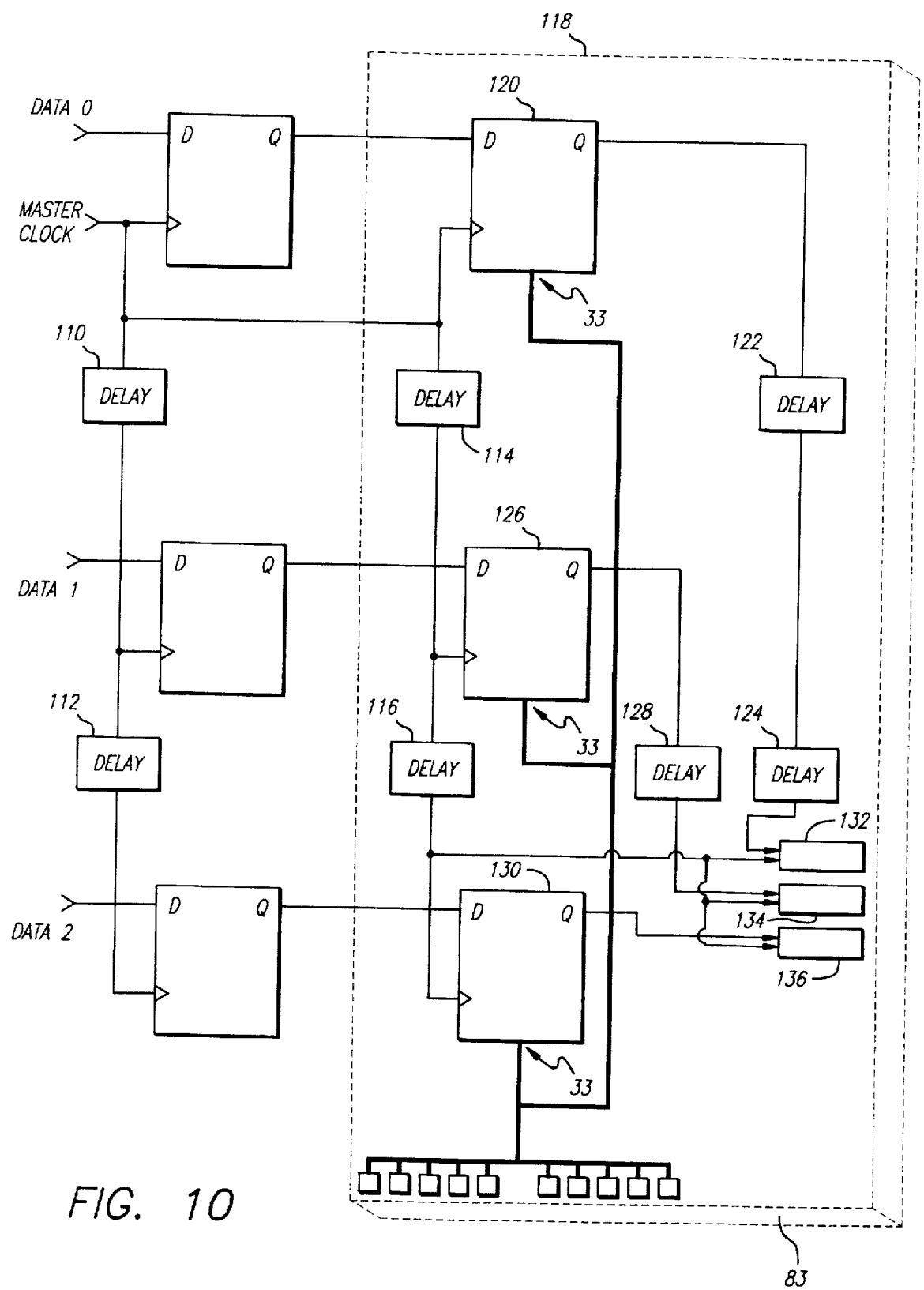

FIG. 9 is a view similar to that shown in FIGS. 7 and 8 and illustrates a third embodiment of the invention with additional advantages compared to the advantages obtained from the embodiments shown in FIGS. 7 and 8; and FIG. 10 is a view similar to that shown in FIGS. 7–9 and illustrates a fourth embodiment of the invention with further advantages compared to the advantages obtained from the embodiments shown in FIGS. 7–9.

Figure 1:
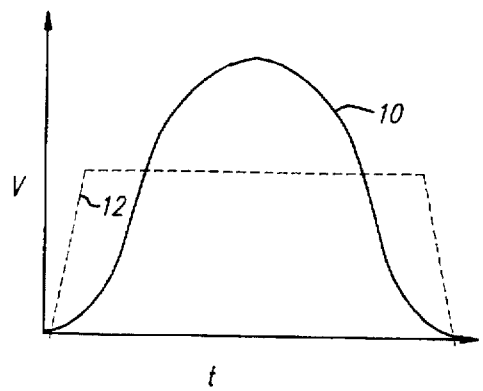
FIG. 1 shows curves of voltages produced at progressive intervals of time in electrical circuitry on an integrated circuit chip.

FIG. 1 illustrates in solid lines a half cycle of a voltage 10 which varies in time on a substantially sinusoidal basis. FIG. 1 also illustrates in broken lines a voltage 12 which may be produced in digital circuitry when the value in the circuitry changes from a binary value of "0" to a binary value of "1". As is well known in the art, distributed capacitances in electrical circuitry on an integrated circuit chip cause substrate currents to flow which are proportional to the time rate-of-change of the voltages shown in FIGS. 1 after they are differentiated with respect to time. This causes currents to be produced from the sinusoidal voltage 10, this current having a wave form such as illustrated at 14 in FIG. 2 for a half cycle of voltage. For a binary waveform having a fast rise and fall time such as illustrated at 12 in FIG. 1, a current is produced with a wave form such as illustrated at 16 in FIG. 2. As will be seen, the current 16 has a large spike at the rising and falling edges of the waveform. The current shown in FIG. 2 is indicated as $$i = C\, dV/dt \quad (1)$$

where i=the current through the distributed capacitances; C=the magnitude of the distributed capacitances; and dV/dt=the differential of the voltages shown in FIG. 2 with respect to time.

Figure 2:
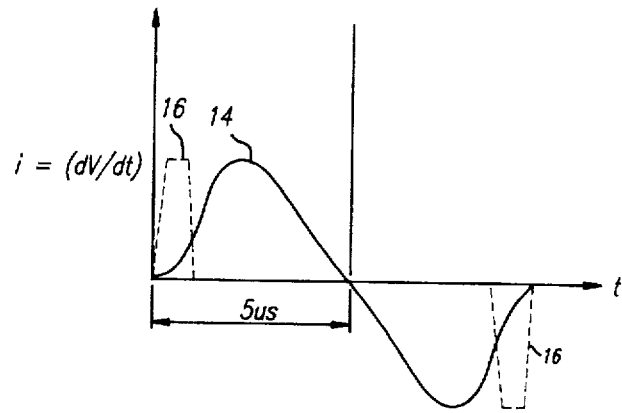
FIG. 2 shows curves of currents produced in the integrated circuit chip in response to the voltage shown in FIG. 1 as a result of distributed capacitances in the electrical circuitry on the integrated circuit chip.

The currents 14 and 16 shown in FIG. 2 are increased in integrated circuit chips in proportion to the capacitances of circuitry included in the chips to protect other transistors in such chips from electrostatic discharges which occur on the inputs to such circuits. Such electrostatic discharge (ESD) protection circuits have relatively large amounts of distributed capacitances. These distributed capacitances proportionately increase the currents shown at 14 and 16 in FIG. 2. As a result, the ESD circuits contribute to the current noise which is produced in the substrate of the chip and, in turn, cause substrate voltage noise across the inductance of the wiring used to ground the substrate.

Figure 5:
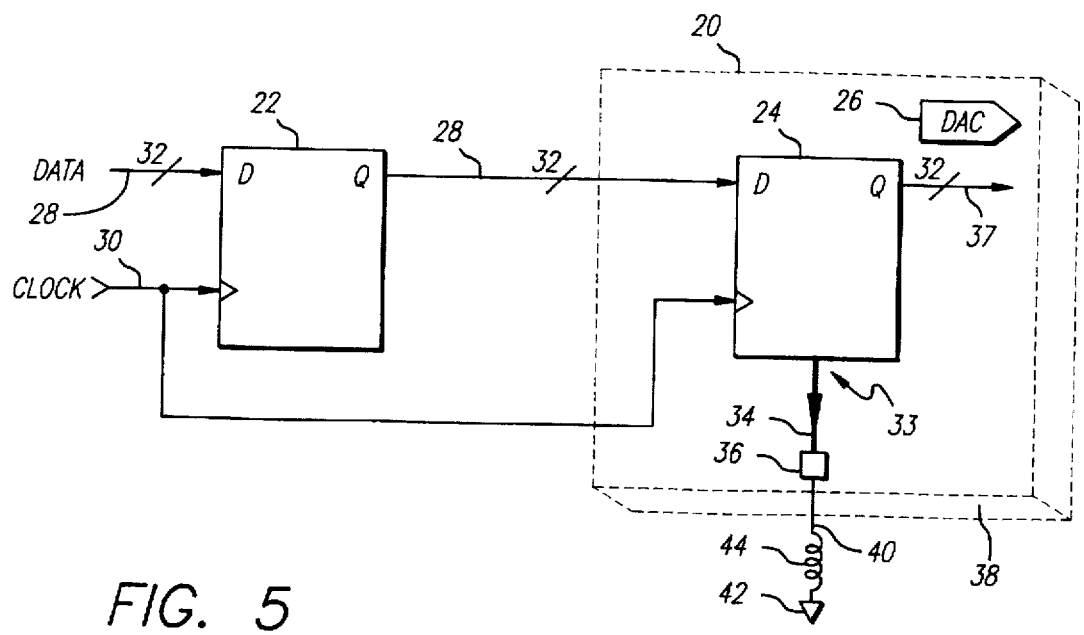
FIG. 5 shows on a simplified block basis electrical circuitry provided in the prior art on an integrated circuit chip to reduce the substrate noise resulting from distributed capacitances in electrical circuitry on an integrated circuit chip.

FIG. 5 illustrates circuitry of the prior art for minimizing the substrate voltage noise resulting from the distributed capacitances in the electrical circuitry on an integrated circuit chip 20. The chip 20 is indicated by broken lines in FIG. 5. As shown in FIG. 5, a 32-latch register 22 is shown off the chip 20 and a 32-latch register 24 is shown on the chip. It will be appreciated that the register 24 may be only one stage of a countless number of circuits on the chip 20. For example, such circuits may include digital circuitry such as the register 24 and may also include analog circuitry such as a digital-to-analog converter (DAC) 26 for converting digital values to analog values.

The effects of substrate voltage noise on digital circuits in an integrated circuit chip are generally not as pronounced as the effects of noise on analog circuits in such chip. This results from the fact that digital circuits provide analog values only of substantially +5 V or 0 V. Because of this, the substrate voltage noise will not affect these values if the noise is less than approximately 1 volt. However, noise will directly affect analog values since the analog values may have an infinite possibility of values. This is particularly true, for example, when the analog signals in a range of approximately 0 to 1 volts such as from the converter 26 represent the entire range of colors to be displayed at successive pixels on a visual display (not shown).

Under the circumstances discussed in the previous paragraph, the noise produced as a result of the currents induced through the distributed capacitors may directly affect the colors produced at the successive pixels on the display monitor. When the resulting voltage noise has spiked characteristics such as shown at 48 in FIG. 3, the noise particularly has deleterious effects on the video image on the display monitor since it may produce on the face of the display monitor momentary changes in pixel luminance commonly designated in the trade as "sparkle".

FIG. 5 shows in schematic block form one embodiment of a system in the prior art for reducing the noise produced as a result of the currents 14 and 16 in FIG. 2. In the embodiment shown in FIG. 5, four (4) bytes of data are introduced in parallel as a single word on a bus 28 extending from the 32 latch register 22 off the chip 20. Each byte of data consists of eight (8) bits. The 32-bit width of the bus 28 is indicated by the number "32" adjacent the bus or line 28 and adjacent a slant (/) symbol on the bus or line 28. The 32-bit register 22 also receives a clock signal on a line 30. The register 22 may constitute a plurality of latches or a plurality of registers or a plurality of any other type of suitable stage well known in the art. When the plurality of bits in each data word are provided in parallel, the number of total latches in the register 22 may correspond to the number of bits in each data word. The clock signal on the line 30 synchronizes the passage of the signals through the register 22.

The synchronized output signals from the register 22 and the clock on the line 30 are introduced to the register 24 on the chip. The register 24 may have a construction corresponding to the register 22. For example, the register 24 may be formed from a number of latches (e.g. 32) corresponding to the number of bits in each word. The register 24 is clocked by the signal on the line 30 and provides a synchronized output on a bus 37 to other stages in the integrated circuit chip. The digital-to-analog converter 26 is an example of such other circuits.

Figure 3:
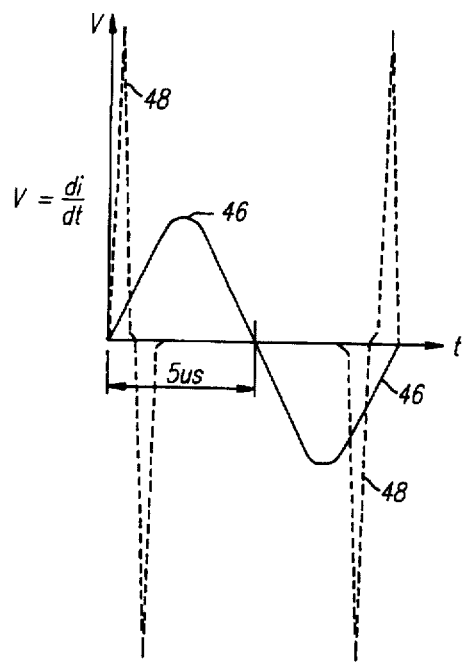
FIG. 3 shows curves of voltages produced in the prior art on pads on the integrated circuit chip as a result of the current shown in FIG. 2 when the electrical circuitry on the chip is connected to pads at the periphery of the chip and the pads are connected through an inductance to a reference potential such as ground.

To reduce the noise produced in the electrical circuitry on the chip 20, a connection is made in the embodiment of FIG. 5 by a line 34 to a pad 36 from a contact, generally indicated at 33, under a substrate 38. Although described as under the register 24, the substrate 38 is well known in the prior art as being under the circuitry of the entire chip. The pad 36 is in turn connected by a line 40 to a reference potential such as an electrical ground 42 disposed externally of the chip 20. Unfortunately, the line 40 has a bond wire and package pin inductance indicated at 44 in FIG. 5. This inductance has an adverse effect as shown in FIG. 3. This adverse effect is produced because the inductance causes a voltage to be produced which is directly proportional to the time differential of the current shown in FIG. 2.

The voltage produced as a result of the time rate of change of the current 14 in FIG. 2 is illustrated in solid lines at 46 in FIG. 3. The voltage produced as a result of the time rate of change of the current 16 in FIG. 2 is illustrated in broken lines at 48 in FIG. 3. The voltages 46 and 48 are produced in accordance with the following equation:

$$V = L\, di/dt \quad (2)$$

where

V=the magnitude of the voltage produced as a result of the flow of current through the line 40;

L—the magnitude of the inductance 44; and di/dt=the time rate of change in the current shown in FIG. 2.

Particularly for digital signals, the voltage produced at the pad 36 can be relatively high.

Figure 6:
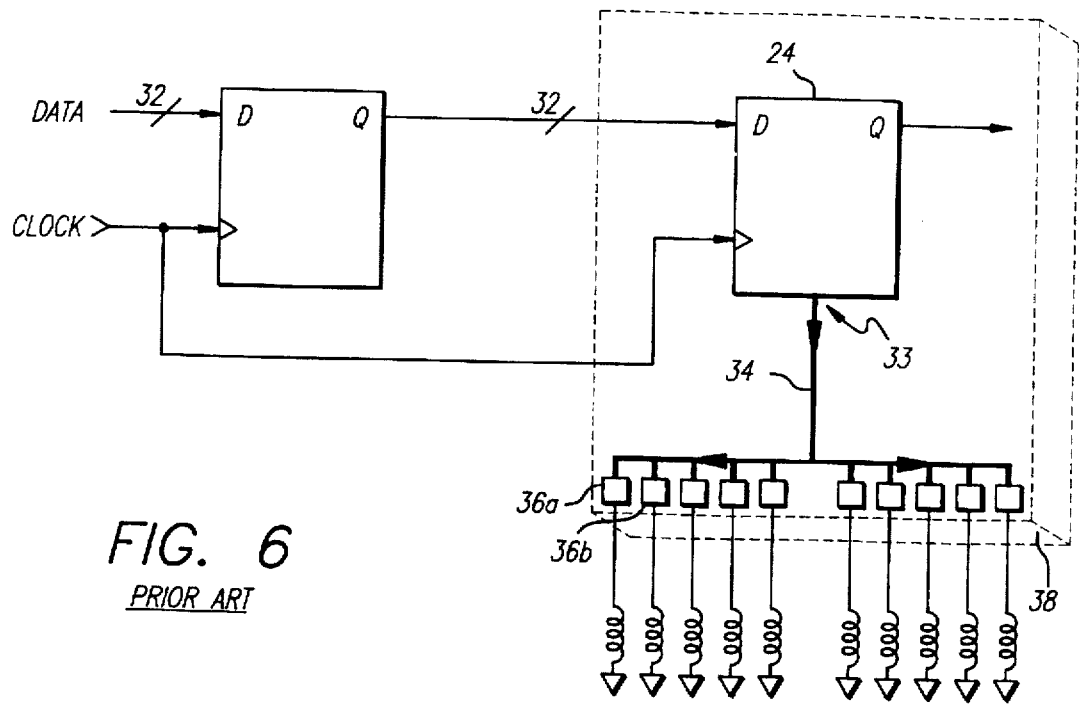
FIG. 6 is a view, similar to that shown in FIG. 5, of the prior art and illustrates electrical circuitry provided on a chip to reduce, even more than the prior art embodiment shown in FIG. 5, the substrate noise resulting from distributed capacitances in electrical circuitry on an integrated circuit chip.

FIG. 6 illustrates an improved system of the prior art for reducing the voltage shown in FIG. 3. The embodiment shown in FIG. 6 is similar to the embodiment shown in FIG. 5 except that it includes a plurality of pads (e.g. 36a, 36b, etc.) connected in parallel on the substrate 38 to the latch 24 through the line 34. By this arrangement, the voltage on the pads (e.g. 36a, 36b, etc.) is reduced by a factor proportional to the number of pads connected in parallel. For example, when ten (10) pads are connected in parallel, the voltage at the pads (e.g. 36a, 36b, etc.) is reduced by a factor of ten (10) from the voltage on the pad 36 shown in FIG. 5. This results from the tenfold decrease in inductance resulting from the connection of ten (10) pads (e.g. 36a, 36b, etc.) in parallel.

The possibility of increasing the number of pads 36 to a greater number than ten (10) has been considered in the prior art since this would decrease the inductance in comparison to the embodiment shown in FIG. 6. For example, an increase to a number of twenty (20) pads would decrease the inductance by a factor of two (2) in comparison to the inductance of the pads in the embodiment shown in FIG. 6. However, pads are at a premium, particularly in the integrated circuit chips with micron sizes less than one (1) micron. This has allowed circuits to be packed on the chips with an increased density. The increased number of circuits on the chips has generally required an increased number of pads to provide inputs to the circuits from external sources and to provide outputs from the circuits to external equipment. Because of this, there is a significant disadvantage in increasing the number of pads above a number such as ten (10).

FIG. 7 illustrates an embodiment of this invention for reducing the noise generated by the distributed capacitances in integrated circuitry on an integrated circuit chip. This chip is generally indicated in broken lines at 60. In the embodiment shown in FIG. 7, the data in each word is separated into two (2) segments. For example, when each word has thirty two (32) bits, half of the bits (bits 0–15) in each word may be introduced through a line 62 to a register 64 off the chip. The other half of the bits (bits 16–31) in each word may be introduced through a line 66 to a register 68 off the chip. A clock signal on a line 70 is also introduced to the register 64 and a clock signal delayed as at 74 is introduced to the register 68.

The synchronized signals from the register 64 are introduced to sixteen (16) pads generally indicated at 73, on the chip 60. The signals from the pads 73 are in turn introduced to a register 72 on the chip. The clock signal on the line 70 passes to a pad 75 on the chip and from the pad 75 to the register 72. In like manner, the signals from the register 68 are introduced to sixteen (16) pads, generally indicated at 76, on the chip and from the pads 76 to a register 78 on the chip. The signals from the logic delay 74 pass to a pad 80 and from the pad 80 to the register 78. As in the embodiment shown in FIG. 6, connections are made from contacts 33 to the substrate 38 under the registers 72 and 78 to a plurality of pads (e.g. 82a, 82b, etc.) disposed over a substrate 38 corresponding to the substrate 38 in FIG. 5 and from the pads to a reference potential such as a ground 84. In the embodiment shown in FIG. 7, ten (10) pads are shown as being connected in parallel.

As will be seen, the bits 0–15 in each word are synchronized in the register 64 with the clock signal from the line 70 at a different time in each cycle relative to the time at which the bits 16–31 in such word are synchronized with the clock signal. This same time difference appears in the bits 0–15 from the register 72 relative to the bits 16–31 from the register 78. This difference causes two (2) different substrate voltage noise signals to be produced as a result of the substrate current from the registers 72 and 78 to the pads 82a, 82b, etc. These two (2) different substrate voltage noise signals are illustrated in FIG. 4 in dotted lines at 84 (from the register 72) and in dashed lines at 86 (from the register 78).

Figure 4:
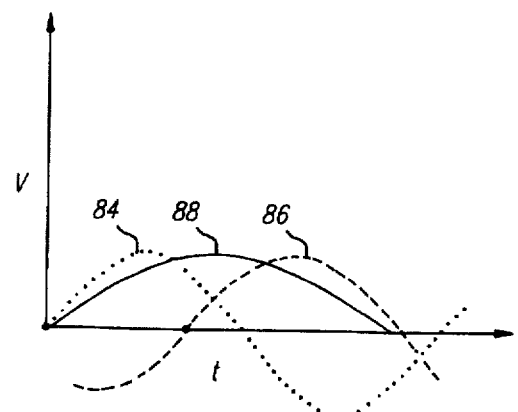
FIG. 4 shows curves similar to that shown in FIG. 3 and illustrates how the circuitry of this invention operates to reduce the amplitude of alternating voltages produced at the pads in comparison to the amplitude of alternating voltages produced on the pads in the prior art.

The signals 84 and 86 in FIG. 4 are combined at the pads 82a, 82b, etc. in FIG. 7 to produce a resultant signal indicated schematically in solid lines at 88 in FIG. 4. Because the signal 84 is produced as a result of the distributed capacitances on only sixteen (16) lines in parallel, the signal 84 has an amplitude with a reduced peak value relative to the peak amplitude of the signal 46 in FIG. 3. For example, assuming that the peak amplitudes of the signals are equal, the peak amplitude of the combined signal 88 in FIG. 7 may be half of the peak amplitude of the signal 46 in FIG. 3 when the signal 86 is displaced by approximately 120° from the signal 84 in FIG. 4. Depending upon the wave shapes of the signals 84 and 86, the time displacement between the signals 84 and 86 may be more than 90°. This is schematically shown by the phase displacement between the signals 84 and 86 in FIG. 4.

As will be appreciated, the magnitude of the distributed capacitances in the lines providing bits 0–15 in each word is one half (½) of the value of the distributed capacitances in the lines providing the bits 0–31 in each word. This results from the fact that the distributed capacitances of only sixteen (16) lines are in parallel. The reduction of the distributed capacitances by a factor of two (2) causes the noise to be decreased by a factor of two (2). A similar reduction is provided in the noise from bits 16–31 in each word. This reduction is in addition to the reduction discussed in the previous paragraph.

In the embodiment shown in FIG. 7, the signals from the resisters 72 and 78 are respectively introduced to registers 90 and 92. The registers 90 and 92 are synchronized in operation with the delayed clock signal from the pad 80. Although the signals introduced to the register 90 from the register 72 have a different time synchronization than the signals from the register 78, this does not affect the operation of the registers 90 and 92. This results from the fact that the signals introduced to the registers 90 and 92 are binary and the output signals from the register 90 have settled to a new value just prior to the time that the output signals from the register 92 change to the new value.

As will be seen in FIG. 7, thirty four (34) pads (16 at 73, one at 75, 16 at 76 and one at 80) are used in the chip 60 to implement the features of this invention. The embodiment shown in FIG. 8 is similar to the embodiment shown in FIG. 7 except that only thirty three (33) pads are used on the chip 60 to implement the invention. This results from the inclusion of an additional logic delay 94 on the chip 60 to receive the clock signal from the pad 75 and to introduce the delayed clock signal to the register 78. The delay 94 replaces the connection from the delay 74 to the pad 80 in FIG. 7 and results in the elimination of the pad 80. The delay in the stage 94 is chosen to match the delay in the stage 74. Because of this, the operation of the system shown in FIG. 8 is substantially the same as the operation of the system shown in FIG. 7. However, it is advantageous in comparison to the system shown in FIG. 7 because it uses one (1) less pad than the system shown in FIG. 7.

The system shown in FIG. 9 is the same in many respects as the system shown in FIG. 8. However, the signals from the register 72 are delayed in a stage 100 before being introduced to a register 102 corresponding to the register 90 in FIG. 7. The delay provided by the stage 100 corresponds to the delays provided by each of the stages 74 and 94 in FIG. 8. In this way, the input signals representing bits 0-15 in each word in the register 102 arrive in time synchronism with the input signals representing bits 16-31 in each word in the register 92. As will be appreciated, because bits 0-15 arrive in each word in time synchronism at the register 102 with bits 16-31 in such word at the register 92, the arrangement of FIG. 9 is capable of operating at higher clock rates than the arrangement of FIG. 8.

FIG. 10 represents a refinement of the system shown in FIG. 9. The embodiment shown in FIG. 10 assumes that there are only three (3) bits in a complete word. However, the same principles apply regardless of the number of bits in each word. In the embodiment shown in FIG. 10, the clock signal for each bit or data in each word is provided with an additional delay relative to the time of the clock signal for the previous bit in such word. This is indicated by no delay in the clock signal on the line for bit or data 0 (or data 0) in each word, a delay 110 in the clock signal for bit 1 (or data 1) in each word and a delay 112 for bit 2 (or data 2) in each word. The delay provided by the stage 112 corresponds to the delay provided by the stage 110.

Delays 114 and 116 respectively corresponding to the delays 110 and 112 are provided in a chip 118. The chip 118 is indicated by dashed lines in FIG. 10. The delays 114 and 116 respectively control the times for the introduction of the clock signal to latches 126 and 130. The output from a latch 120 for bit 0 in each byte is then provided with two (2) delays 122 and 124 each corresponding to the delays 110 and 112 or to the delays 114 and 116. The output from the latch 126 is provided with a single delay 128 corresponding to the delays 116 or 112. The logic signals from the latch 130 and from the delays 128 and 124 are respectively introduced to latches 136, 134 and 132. The clock signals from the delay 116 are also introduced to the latches 136, 134 and 132. As will be appreciated, because there is a clock delay provided between each bit, the arrangement of FIG. 10 produces less substrate noise than that of FIG. 9.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination for operating upon information words each having a plurality of bits where the bits in each word are separated into at least a pair of segments the first of which is clocked by a first clock signal having a particular frequency and the second of which is clocked by a second clock signal having the particular frequency and delayed by a particular time from the first clock frequency, an integrated circuit chip having a substrate and integrated circuitry on the substrate and distributed capacitances between the integrated circuitry and the substrate and a plurality of pads on the substrate, first latch means disposed on the integrated circuit chip for receiving at least a first one of the bits and the first clock signal and for providing at least a first output bit latched to the first clock signal, second latch means disposed on the integrated circuit chip for receiving at least a second one of the bits and a clock signal having a delay corresponding to the delay of the second clock signal and for providing at least a second output bit latched to such delayed clock signal, and means for commonly connecting the first and second latch means to at least an individual one of the pads in the plurality to minimize the effect of the distributed capacitances on the electrical circuitry on the substrate.

2. In a combination as set forth in claim 1, the connecting means being commonly connected to a multiple number of pads including the at least one of the pads in the plurality to minimize the effect of the distributed capacitances on the electrical circuitry on the substrate.

3. In a combination as set forth in claim 1, the connecting means connecting the first and second latch means directly to the at least individual one of the pads in the plurality to minimize the effect of the distributed capacitance on the electrical circuitry on the substrate.

4. In combination for operating upon information words each having a plurality of bits where the bits in each word are separated into at least a pair of segments, an integrated circuit chip having a substrate and integrated circuitry on the substrate and distributed capacitances between the integrated circuitry and the substrate and a plurality of pads on the substrate, first means for providing a first clock signal having a particular clock frequency, second means for providing a second clock signal having the particular clock frequency and delayed by a particular time from the first clock signal, first latch means disposed on the integrated circuit chip for receiving at least a first one of the bits and the first clock signal and for providing at least a first output bit latched to the first clock signal, second latch means disposed on the integrated circuit chip for receiving at least a second one of the bits and a clock signal having a delay corresponding to the delay of the second clock signal and for providing at least a second output bit latched to such delayed clock signal, and third means for commonly connecting the first and second latch means to at least an individual one of the pads in the plurality to minimize the effect of the distributed capacitances on the electrical circuitry on the substrate.

5. In a combination as set forth in claim 4 wherein the second means provides the second clock signals off the integrated circuit chip and wherein the integrated circuit chip includes an additional one of the pads for receiving the second clock signals and for providing for the introduction of the second clock signals to the second latch means.

6. In a combination as set forth in claim 4 wherein the second means provides the second clock signals on the integrated circuit chip and introduces the second clock signals to the second latch means.

7. In a combination as set forth in claim 4 wherein the connecting means connects the first and second latch means directly to the at least individual one of the pads in the plurality to minimize the effect of the distributed capacitances on the electrical circuitry on the substrate.

* * * * *